(12) United States Patent
Kumar et al.

(10) Patent No.: US 8,048,474 B2
(45) Date of Patent: Nov. 1, 2011

(54) METHOD OF MAKING NONVOLATILE MEMORY CELL CONTAINING CARBON RESISTIVITY SWITCHING AS A STORAGE ELEMENT BY LOW TEMPERATURE PROCESSING

(75) Inventors: Tanmay Kumar, Pleasanton, CA (US); Er-Xuan Ping, Fremont, CA (US); Alper Ilkbahar, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 755 days.

(21) Appl. No.: 12/222,341

(22) Filed: Aug. 7, 2008

(65) Prior Publication Data

US 2009/0258135 A1 Oct. 15, 2009

Related U.S. Application Data

(60) Provisional application No. 61/071,088, filed on Apr. 11, 2008.

(51) Int. Cl.
*B05D 5/12* (2006.01)
*H01L 21/20* (2006.01)

(52) U.S. Cl. .......... 427/58; 427/101; 427/122; 438/237; 438/478

(58) Field of Classification Search ............... 427/58, 427/101, 122; 438/237, 478
See application file for complete search history.

(56) References Cited

U.S. PATENT DOCUMENTS

| | | | |
|---|---|---|---|
| 3,404,061 A | 10/1968 | Shane et al. | |
| 5,915,167 A | 6/1999 | Leedy | |
| 6,055,180 A | 4/2000 | Gudesen et al. | |
| 6,548,313 B1* | 4/2003 | Ravi et al. .......................... | 438/6 |
| 6,574,130 B2 | 6/2003 | Segal et al. | |
| 6,706,402 B2 | 3/2004 | Rueckes et al. | |
| 6,815,704 B1 | 11/2004 | Chen | |
| 7,081,377 B2 | 7/2006 | Cleeves | |
| 7,105,108 B2 | 9/2006 | Kaschak et al. | |
| 7,113,426 B2 | 9/2006 | Rueckes et al. | |
| 7,176,064 B2 | 2/2007 | Herner | |
| 7,345,907 B2 | 3/2008 | Scheuerlein | |
| 7,492,630 B2 | 2/2009 | Scheuerlein et al. | |
| 2005/0012119 A1 | 1/2005 | Herner et al. | |
| 2005/0226067 A1 | 10/2005 | Herner et al. | |
| 2006/0087005 A1* | 4/2006 | Herner .......................... | 257/616 |
| 2006/0108667 A1 | 5/2006 | Lung | |
| 2006/0141679 A1 | 6/2006 | Subramanian et al. | |
| 2006/0250836 A1 | 11/2006 | Herner et al. | |

(Continued)

FOREIGN PATENT DOCUMENTS

EP 1 780 814 A2 5/2007

(Continued)

OTHER PUBLICATIONS

International Bureau of WIPO. International Preliminary Report on Patentability, Intl. Application PCT/US09/39127. Oct. 21, 2010. 7 pages.

(Continued)

*Primary Examiner* — Brian K Talbot
(74) *Attorney, Agent, or Firm* — The Marbury Law Group, PLLC

(57) ABSTRACT

A method of making a nonvolatile memory cell includes forming a steering element and forming a carbon resistivity switching material storage element by coating a carbon containing colloid.

25 Claims, 1 Drawing Sheet

U.S. PATENT DOCUMENTS

| | | | |
|---|---|---|---|
| 2006/0250837 A1 | 11/2006 | Herner et al. | |
| 2007/0008773 A1 | 1/2007 | Scheuerlein | |
| 2007/0029546 A1 | 2/2007 | Cho et al. | |
| 2008/0237599 A1 | 10/2008 | Herner et al. | |
| 2008/0239790 A1 | 10/2008 | Herner et al. | |
| 2009/0168492 A1 | 7/2009 | Thorp et al. | |
| 2009/0194839 A1* | 8/2009 | Bertin et al. | 257/476 |

FOREIGN PATENT DOCUMENTS

| | | |
|---|---|---|
| EP | 1 816 680 A1 | 8/2007 |
| EP | 2 043 156 A2 | 4/2009 |

OTHER PUBLICATIONS

International Bureau of WIPO. International Preliminary Report on Patentability, Intl. Application PCT/US09/39126. Oct. 21, 2010. 7 pages.

International Bureau of WIPO. International Preliminary Report on Patentability, Intl. Application PCT/US09/39120. Oct. 21, 2010. 7 pages.

Notice of Allowance mailed Feb. 17, 2010 received in U.S. Appl. No. 12/153,874.

U.S. PTO Office Action mailed Jan. 12, 2010 received in U.S. Appl. No. 12/153,872.

M. C. Lemme et al., "Mobility in grapheme double gate field effect transistors," Solid State Electronics, vol. 52, No. 4, Feb. 20, 2008, pp. 514-518.

International Search Report and Written Opinion mailed Aug. 10, 2009 in International Application No. PCT/US2009/039127.

International Search Report and Written Opinion mailed Jul. 30, 2009, received in International Application No. PCT/US2009/039126.

International Search Report and Written Opinion mailed Aug. 11, 2009, received in International Application No. PCT/US2009/039120.

Office Action mailed Oct. 29, 2009, received in U.S. Appl. No. 12/153,874.

U.S. Appl. No. 09/560,626, filed Apr. 28, 2000, Knall.
U.S. Appl. No. 12/007,780, filed Jan. 15, 2008, Herner et al.
U.S. Appl. No. 12/007,781, filed Jan. 15, 2008, Dunton et al.
U.S. Appl. No. 12/153,872, filed May 27, 2008, Chen et al.
U.S. Appl. No. 12/153,873, filed May 27, 2008, Chen et al.
U.S. Appl. No. 12/153,874, filed May 27, 2008, Chen el al.

A. M. Rao et al., In situ-grown carbon nanotube array with excellent field emission characteristics, Applied Physics Letters, (2000), pp. 3813-3815, vol. 76, No. 25.

Tomohiro Nozaki et al., Fabrication of vertically aligned single-walled carbon nanotubes in atmospheric pressure non-thermal plasma CVD, Carbon, (2007), pp. 364-374, vol. 45.

E. Salonen et al., Ion-irradiation-induced defects in bundles of carbon nanotubes, Nuclear Instruments and Methods in Physics Research B, (2002), pp. 603-608, vol. 193.

Jun Li et al., Bottom-up approach for carbon nanotube interconnects, Applied Physics Letters, (2003), pp. 2491-2493, vol. 82, No. 15.

Hua-Chiang Wen et al., Effects of ammonia plasma treatment on the surface characteristics of carbon fibers, Surface & Coatings Technology, (2006), pp. 3166-3169, vol. 200.

M Meyyappan et al., Carbon nanotube growth by PECVD: a review, Plasma Sources Sci. Technol., (2003), pp. 205-216, vol. 12.

Y. Abdi et al., PECVD-grown carbon nanotubes on silicon substrates with a nickel-seeded tip-growth structure, Materials Science and Engineering C, (2006), pp. 1219-1223, vol. 26.

J. B. Cui et al., Carbon nanotube memory devices of high charge storage stability, Applied Physics Letters, (2002), pp. 3260-3262, vol. 81, No. 17.

Young Min Shin et al., Influence of morphology of catalyst thin film on vertically aligned carbon nanotube growth, Journal of Crystal Growth, (2004), pp. 81-89, vol. 271.

P. Smith et al., Polishing TiN for Nanotube Synthesis, Proceedings of the 16th Annual Meeting of the American Society for Precision Engineering, (2001), Crystal City, VA.

Kevin Bullis, TR10: Graphene Transistors A new fomr of carbon being pioneered by Walter de Heer of Georgia Tech could lead to speedy, compact computer processors, Technology Review, (2008), vol. 20242.

William S. Hummers et al., Preparation of Graphitic Oxide, Journal of American Chemical Society, (1958), pp. 1339, vol. 80.

K.S. Novoselov et al., Electric field effect in atomically thin carbon films, Science, (2004), pp. 666-669, vol. 306.

Dan Li et al., Processable aqueous dispersions of grapheme nanosheets, Nature Nanotechnology, (2008), pp. 101-105, vol. 3, Nature Publishing Group.

Nina Kovtyukhova et al., Layer-by-layer assembly of ultrathin composite films from micron-sized graphite oxide sheets and polycations, American Chemical Society (1999), pp. 771-778, vol. 11.

* cited by examiner

METHOD OF MAKING NONVOLATILE MEMORY CELL CONTAINING CARBON RESISTIVITY SWITCHING AS A STORAGE ELEMENT BY LOW TEMPERATURE PROCESSING

This application claims benefit of priority to U.S. Application Ser. No. 61/071,088 filed on Apr. 11, 2008 and incorporated herein by reference in its entirety.

BACKGROUND OF THE INVENTION

The invention relates to a nonvolatile memory array.

Nonvolatile memory arrays maintain their data even when power to the device is turned off. In one-time programmable arrays, each memory cell is formed in an initial unprogrammed state, and can be converted to a programmed state. This change is permanent, and such cells are not erasable. In other types of memories, the memory cells are erasable, and can be rewritten many times.

Cells may also vary in the number of data states each cell can achieve. A data state may be stored by altering some characteristic of the cell which can be detected, such as current flowing through the cell under a given applied voltage or the threshold voltage of a transistor within the cell. A data state is a distinct value of the cell, such as a data '0' or a data '1'.

SUMMARY OF THE EMBODIMENTS

One embodiment of the invention provides a method of making a nonvolatile memory cell, comprising forming a steering element and forming a graphene storage element, wherein the step of forming the graphene storage element comprises providing a graphene colloid, and coating the graphene colloid over a substrate to form a graphene layer.

Another embodiment of the invention provides a method of making a nonvolatile memory cell, comprising forming a steering element and forming a carbon resistivity switching material storage element, wherein the step of forming the storage element comprises providing a graphene oxide colloid, coating the graphene oxide colloid over a substrate to form a graphene oxide layer; and reducing the graphene oxide layer to a resistivity switching material layer comprising at least one of graphene, microcrystalline, nanocrystalline, polycrystalline or amorphous carbon layer.

Another embodiment of the invention provides a method of making a nonvolatile memory device, comprising forming a steering element and forming a carbon resistivity switching material storage element wherein the step of forming the storage element comprises providing graphite flakes, chemically separating graphite flakes into carbon sheets comprising at least one of graphene, microcrystalline, nanocrystalline, polycrystalline or amorphous carbon sheets, breaking the carbon sheets into carbon pieces to form a carbon colloid, and coating the carbon colloid over a substrate to form a resistivity switching material layer comprising at least one of graphene, microcrystalline, nanocrystalline, polycrystalline or amorphous carbon layer.

Another embodiment of the invention provides a method of making a nonvolatile memory cell, comprising forming a steering element, and forming a carbon resistivity switching material storage element, wherein the step of forming the storage element comprises providing a graphite source material, oxidizing the graphite source material to form graphite oxide, converting the graphite oxide to a graphene oxide colloid, reducing the graphene oxide colloid to a carbon colloid, and coating the carbon colloid over a substrate to form a resistivity switching material layer comprising at least one of graphene, microcrystalline, nanocrystalline, polycrystalline or amorphous carbon layer.

DETAILED DESCRIPTION OF THE PREFERRED EMBODIMENTS

Figure 1:
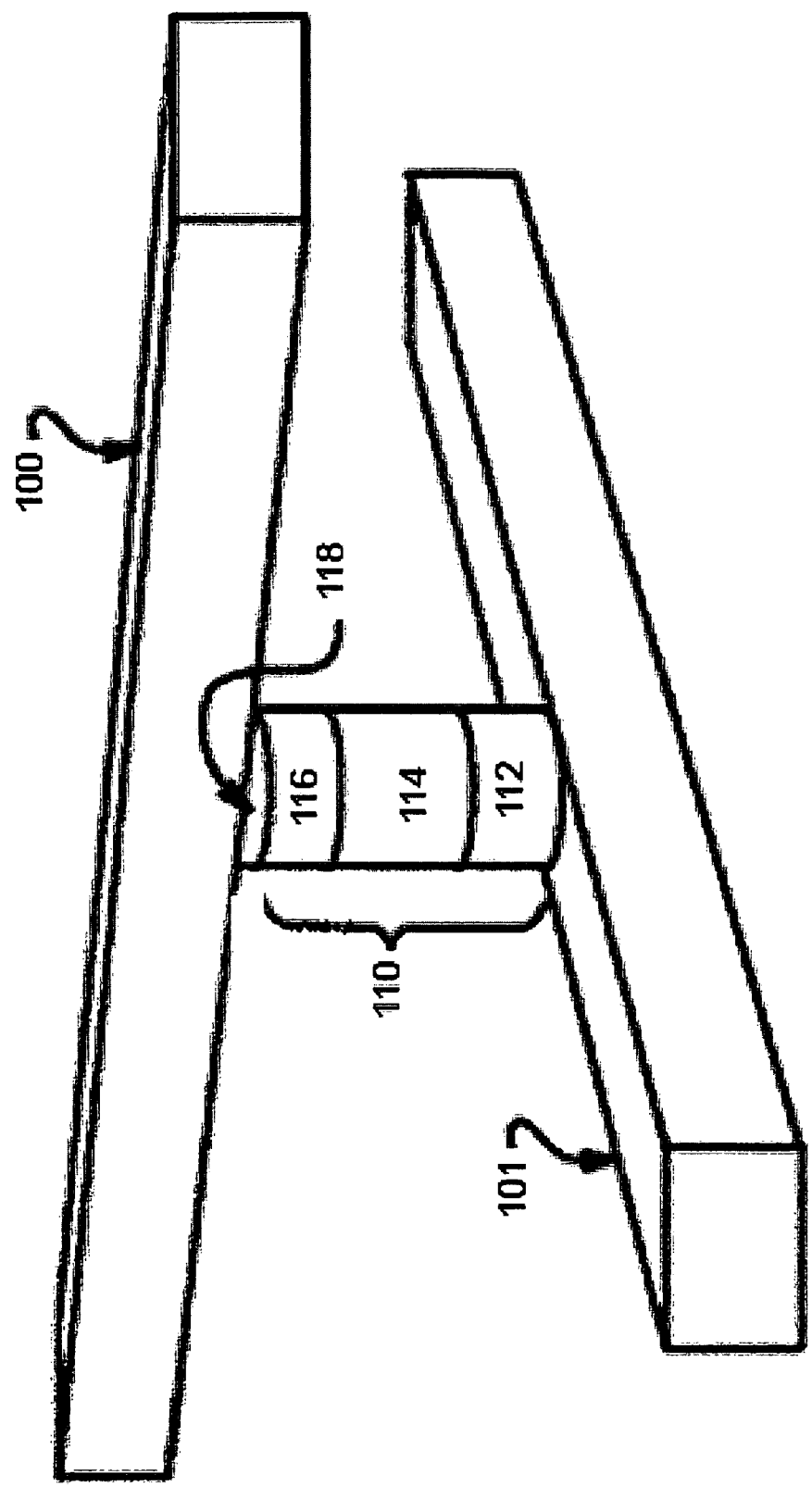
FIG. 1 is a perspective view of a memory cell formed according to a preferred embodiment of the present invention.

In general, a memory cell comprises a storage element and a steering element. The steering element can be a diode or a transistor. Carbon materials have been observed to show resistive switching characteristics. Carbon resistivity switching materials, include but are not limited to graphene (such as one or more layers of graphene, which is a two-dimensional carbon nanostructure), microcrystalline, nanocrystalline, polycrystalline or amorphous carbon. Such characteristics makes the carbon resistivity switching material, such as graphene, a candidate material for a storage element of the nonvolatile memory cell. However, graphene films are usually deposited, for example by CVD methods, at high temperature (about 700-800° C. or higher). This high temperature process makes graphene incompatible with some steering elements, such as semiconductor diodes and transistors which cannot withstand such high temperatures. If subjected to such a high temperature, the performance of a diode as a steering element will degrade. For example, the reverse leakage current may increase significantly. Similar performance degradations occur to field effect transistors.

By depositing carbon resistivity switching materials, such as graphene, at low temperature, including but not limited to room temperature processes, nonvolatile memory cells comprising a carbon resistivity switching material elements (such as graphene storage elements) can be produced without sacrificing the performance of the steering element of the memory cell and the underlying CMOS transistors of the driver circuit located on the substrate. In the following embodiments, graphene is described as the carbon resistivity switching material. However, it should be understood that the carbon resistivity switching material may comprise one or more of microcrystalline, nanocrystalline, polycrystalline or amorphous carbon, preferably but not necessarily in flake form. In other words, some or all of the carbon material may not have a perfect graphene lattice structure, but instead may comprise microcrystalline, nanocrystalline, polycrystalline and/or amorphous carbon flakes.

One embodiment of the invention provides a method of making a nonvolatile memory cell, comprising forming a steering element and forming a graphene storage element, wherein the step of forming the graphene storage element comprises providing graphene oxide, converting the graphene oxide into a graphene oxide colloid, reducing the graphene oxide colloid to a graphene colloid, and coating the graphene colloid over a substrate to form a graphene layer. Alternatively, the graphene oxide can be converted to graphene after the colloid is deposited over the substrate.

The colloid can be obtained from a graphite or graphene oxide source material. For example, the graphite oxide can be firstly obtained from graphite by a modified Hummers method as originally presented by Kovtyukhova and colleagues (Hummers et al., *J. Am. Chem. Soc.* 80, 1339 (1958), and Kovtyukhova et al., *Chem. Mater.* 11, 771-778 (1999), and as described in Li et al., *Nature Nanotechnology*, 3, 101-

105 (2008)), which are all hereby incorporated by reference. As-synthesized graphite oxide can be suspended in water to give a brown dispersion, which is subjected to dialysis to completely remove residual salts and acids. Ultrapure Milli-Q® water can be used. As-purified graphite oxide suspensions can be then dispersed in water to create an around 0.05 wt % dispersion. Exfoliation of graphite oxide to graphene oxide colloids can be achieved by ultrasonication of the dispersion using a Brandson Digital Sonifier (S450D, 500 W, 30% amplitude) for 30 min. In order to obtain graphene oxide colloid, the above obtained brown dispersion can be then subjected to 30 min of centrifugation at 3,000 r.p.m. to remove any unexfoliated graphite oxide (usually present in a very small amount) using an Eppendorf 5702 centrifuge with a rotor radius of 14 cm. The resulting homogeneous dispersion (5.0 ml) can be mixed with 5.0 ml of water, 5.0 µl of hydrazine solution (35 wt % in water, Aldrich) and 35.0 µl of ammonia solution (28 wt % in water, Crown Scientific) in a 20-ml glass vial to further obtain a grahene colloid. The weight ratio of hydrazine to graphene oxide can be about 7:10. After being vigorously shaken or stirred for a few minutes, the vial can be put in a water bath (~95° C.) for 1 h. The obtained graphene colloid can be sprayed or spin coated onto a surface to form a graphene layer. The graphene colloid can be coated over the steering element or under the steering element of the memory cell. As noted above, some or all graphene may be substituted with microcrystalline, nanocrystalline, polycrystalline and/or amorphous carbon flakes, depending on the processing conditions.

The concentration of hydrazine in the reduction mixture can be varied from 0.0175 wt % (used in the above procedure) to 1.75 wt %. In order to obtain stable dispersions when the concentration is greater than 0.0175 wt %, excess hydrazine in the resulting dispersions can be removed by dialysis against an around 0.5% ammonia solution once the reduction is complete. Reducing reagents and bases other than hydrazine and or ammonia can be also be used.

In another embodiment, the graphene oxide colloid can be spin on or sprayed onto a surface to form a graphene oxide layer. The formed graphene oxide layer can then be reduced to a graphene layer by hydrazine or other reducing reagents. The graphene oxide colloid can be coated over the steering element or under the steering element. As noted above, some or all graphene may be substituted with microcrystalline, nanocrystalline, polycrystalline and/or amorphous carbon flakes, depending on the processing conditions, such as on the reducing treatment.

In another embodiment, a graphene colloid can contain graphene pieces, obtained by chemically separating graphite flakes into graphene sheets followed by breaking the graphene sheets into graphene pieces to further form a colloid of graphene. As noted above, some or all graphene may be substituted with microcrystalline, nanocrystalline, polycrystalline and/or amorphous carbon flakes, depending on the processing conditions, such as the chemical and physical processing conditions. The obtained graphene colloid can be sprayed or spin coated onto a surface to form a graphene layer. The graphene colloid can be coated over the steering element or can be coated under the steering element. Exemplary methods of making a graphene colloid from graphite flakes can be found in U.S. Pat. Nos. 3,404,061 and 7,105,108; see also Science 22 Oct. 2004, Vol. 306. no. 5696, pp. 666-669 (mechanical exfoliation of graphite to form graphene), which are all hereby incorporated by reference.

The steering element can be a transistor or a diode. If the steering element is a diode, the graphene layer as a storage element can be arranged vertically and/or horizontally and/or patterned to form a pillar or block having a substantially cylindrical shape. An adhesion layer, for example but not limited to titanium nitride, can be formed between the graphene layer and the steering element. Thermal anneal steps can be added if needed. Thickness of the graphene layer can be varied to a desirable range.

In preferred embodiments, the memory cell includes a cylindrical semiconductor diode is located in series with a cylindrical graphene layer or film. The diode and the film are disposed between two electrodes, as illustrated in FIG. 1. The number of graphene layers or films need not be limited to one; for example, it can be two or more. The diode and graphene film may have a shape other than cylindrical, if desired. For a detailed description of a the design of a memory cell comprising a diode as a steering element, see for example U.S. patent application Ser. No. 11/125,939 filed on May 9, 2005 (which corresponds to US Published Application No. 2006/0250836 to Herner et al.), and U.S. patent application Ser. No. 11/395,995 filed on Mar. 31, 2006 (which corresponds to US Patent Published Application No. 2006/0250837 to Herner et al.,) each of which is hereby incorporated by reference. In the preferred embodiments of the invention, the graphene film serves as the resistivity switching element and the diode as the steering element of the memory cell.

For example, FIG. 1 illustrates the perspective view of a memory cell formed according to a preferred embodiment of the present invention. A bottom conductor 101 is formed of a conductive material, for example tungsten, and extends in a first direction. Barrier and adhesion layers, such as TiN layers, may be included in bottom conductor 101. The semiconductor diode 110 has a bottom heavily doped n-type region 112; an intrinsic region 114, which is not intentionally doped; and a top heavily doped p-type region 116, though the orientation of this diode may be reversed. Such a diode, regardless of its orientation, will be referred to as a p-i-n diode or simply diode. A graphene layer 118 is disposed on the diode, either on the top region 116 or below the bottom region 112 of the diode 110. Top conductor 100 may be formed in the same manner and of the same materials as bottom conductor 101, and extends in a second direction different from the first direction. The semiconductor diode 110 is vertically disposed between bottom conductor 101 and top conductor 100. The diode can comprise any single crystal, polycrystalline, or amorphous semiconductor material, such as silicon, germanium, or silicon-germanium alloys.

The resistivity of the graphene storage elements can be changed between stable states by applying appropriate electrical pulses. In the preferred embodiments, the set and reset transitions are performed with graphene under bias. More than one programming pulse can be used. For example, a plurality of bias pulses are applied to the cell to switch the resistivity of the graphene oxide layer.

The memory cell can be a read/write memory cell or a rewritable memory cell. The memory cell can be further located in a three dimensional array of memory cells.

Generally, a device for programming the memory cells is a driver circuit located under, over, or adjacent to the memory cell. The circuit can have a monolithic integrated structure, or a plurality of integrated device packaged together or in close proximity or die-bonded together. For a detailed descriptions of the driver circuit, see for example, U.S. patent application Ser. No. 10/185,508 by Cleeves; U.S. patent application Ser. No. 09/560,626 by Knall; and U.S. Pat. No. 6,055,180 to Gudensen et al., each of which is hereby incorporated by reference.

The above described memory cell may be located in a one memory level device. If desired, additional memory levels can be formed above the first memory level to form a monolithic three dimensional memory array. In some embodiments, conductors can be shared between memory levels; i.e. top conductor of one memory lever would serve as the bottom conductor of the next memory level. In other embodiments, an interlevel dielectric can be formed above the first memory level, its surface planarized, and construction of a second memory level begins on this planarized interlevel dielectric, with no shared conductors.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method of making a nonvolatile memory cell, comprising:
   forming a steering element; and
   forming a graphene storage element;
   wherein the step of forming the graphene storage element comprises:
   providing a graphene colloid; and
   coating the graphene colloid over a substrate to form a graphene layer.

2. The method of claim 1, wherein the step of coating the graphene colloid over a substrate comprises spraying or spin coating the graphene colloid.

3. The method of claim 1, further comprising:
   providing a graphite source material;
   oxidizing the graphite source material to form graphite oxide;
   converting the graphite oxide to a graphene oxide colloid; and
   reducing the graphene oxide colloid to the graphene colloid.

4. The method of claim 3, wherein the step of coating the graphene colloid forms a graphene layer over the steering element.

5. The method of claim 3, wherein the step of reducing the graphene oxide colloid comprises using hydrazine as a reducing reagent.

6. The method of claim 3, wherein the step of coating the graphene colloid forms a graphene layer under the steering element.

7. The method of claim 1, wherein the steering element is a diode.

8. The method of claim 1, further comprising patterning the diode and the graphene layer such that the diode and the graphene layer form a pillar having a substantially cylindrical shape.

9. The method of claim 1, wherein the steering element is a transistor.

10. The method of claim 1, further comprising thermally annealing the graphene layer.

11. The method of claim 1, wherein:
    the memory cell is a read/write memory cell or a rewritable memory cell; and
    the memory cell is located in a monolithic three dimensional array of memory cells.

12. A method of making a nonvolatile memory cell, comprising:
    forming a steering element; and
    forming a carbon resistivity switching material storage element;
    wherein the step of forming the storage element comprises:
    providing a graphene oxide colloid;
    coating the graphene oxide colloid over a substrate to form a graphene oxide layer; and
    reducing the graphene oxide layer to a resistivity switching material layer comprising at least one of graphene, microcrystalline, nanocrystalline, polycrystalline or amorphous carbon layer.

13. The method of claim 12, further comprising:
    providing a graphite source material;
    oxidizing the graphite source material to form graphite oxide; and
    converting the graphite oxide to the graphene oxide colloid.

14. The method of claim 12, wherein the step of reducing the graphene oxide layer comprises using hydrazine as a reducing reagent.

15. The method of claim 12, wherein the step of coating the graphene oxide colloid over a substrate comprises spraying or spinning on the graphene oxide colloid.

16. The method of claim 12, wherein the step of coating the graphene oxide colloid forms a graphene oxide layer over the steering element.

17. The method of claim 12, wherein the step of coating the graphene oxide colloid forms a graphene oxide layer prior to forming the steering element such that the resistivity switching material layer is located under the steering element.

18. The method of claim 12, wherein the steering element is a diode or a transistor and the resistivity switching material layer comprises the graphene layer.

19. A method of making a nonvolatile memory device, comprising:
    forming a steering element; and
    forming a carbon resistivity switching material storage element;
    wherein the step of forming the storage element comprises:
    providing graphite flakes;
    chemically separating graphite flakes into carbon sheets comprising at least one of graphene, microcrystalline, nanocrystalline, polycrystalline or amorphous carbon sheets;
    breaking the carbon sheets into carbon pieces to form a carbon colloid; and
    coating the carbon colloid over a substrate to form a carbon resistivity switching material layer comprising at least one of graphene, microcrystalline, nanocrystalline, polycrystalline or amorphous carbon layer.

20. The method of claim 19, wherein the step of coating the carbon colloid over a substrate comprises spraying or spin coating the carbon colloid.

21. The method of claim 19, wherein the step of coating the carbon colloid forms the resistivity switching material layer over or under the steering element.

22. The method of claim 19, wherein the steering element is a diode or a transistor.

23. A method of making a nonvolatile memory cell, comprising:
    forming a steering element; and
    forming a carbon resistivity switching material storage element;
    wherein the step of forming the storage element comprises:
    providing a graphite source material;
    oxidizing the graphite source material to form graphite oxide;
    converting the graphite oxide to a graphene oxide colloid;
    reducing the graphene oxide colloid to a carbon colloid; and
    coating the carbon colloid over a substrate to form a resistivity switching material layer comprising at least one of graphene, microcrystalline, nanocrystalline, polycrystalline or amorphous carbon layer.

24. The method of claim 23, wherein the a resistivity switching material layer comprises the graphene layer.

25. The method of claim 23, wherein the a resistivity switching material layer comprises the microcrystalline, nanocrystalline, polycrystalline or amorphous carbon layer.

* * * * *